United States Patent [19]
Johnson et al.

[11] Patent Number: 6,034,415
[45] Date of Patent: Mar. 7, 2000

[54] LATERAL RF MOS DEVICE HAVING A COMBINED SOURCE STRUCTURE

[75] Inventors: Joseph Herbert Johnson, Sunnyvale; Pablo Eugenio D'Anna, Los Altos, both of Calif.

[73] Assignee: Xemod, Inc., Sunnyvale, Calif.

[21] Appl. No.: 09/289,370

[22] Filed: Apr. 8, 1999

Related U.S. Application Data

[62] Division of application No. 09/020,257, Feb. 7, 1998.

[51] Int. Cl.$^7$ .................................................... H01L 29/40
[52] U.S. Cl. ............................................ 257/621; 257/624
[58] Field of Search .................................... 257/621, 345, 257/382, 622, 623, 624, 625

[56] References Cited

U.S. PATENT DOCUMENTS

| | | |
|---|---|---|
| 3,761,782 | 9/1973 | Youmans . |
| 4,163,988 | 8/1979 | Yeh et al. . |
| 4,505,799 | 3/1985 | Baxter . |
| 4,537,654 | 8/1985 | Berenz et al. . |
| 4,821,095 | 4/1989 | Temple . |
| 4,951,099 | 8/1990 | Berenz et al. . |
| 5,037,782 | 8/1991 | Nakamura et al. . |
| 5,079,602 | 1/1992 | Harada et al. . |
| 5,084,750 | 1/1992 | Adlerstein . |

*Primary Examiner*—Sheila V. Clark
*Attorney, Agent, or Firm*—Boris G. Tankhilevich

[57] ABSTRACT

A lateral RF MOS device having a combined source connection structure is disclosed. The combined source connection structure utilizes a diffusion area and a conductive plug region. In one embodiment, the diffusion source area forms a contact region connecting the top surface of the semiconductor material to a highly conductive substrate of the lateral RF MOS transistor structure. In another embodiment, the diffusion source area is located completely within the epitaxial layer of the lateral RF MOS transistor structure. The conductive plug region makes a direct physical contact between a backside of the semiconductor material and the diffusion contact area.

10 Claims, 3 Drawing Sheets

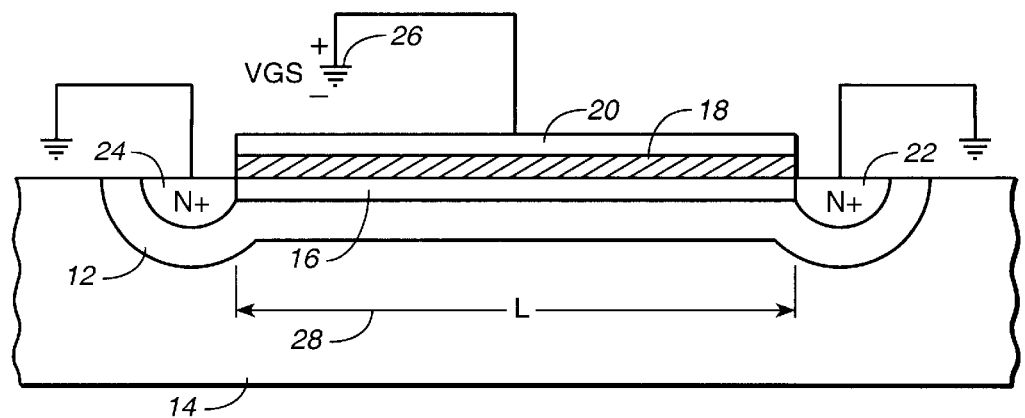
FIG._1A
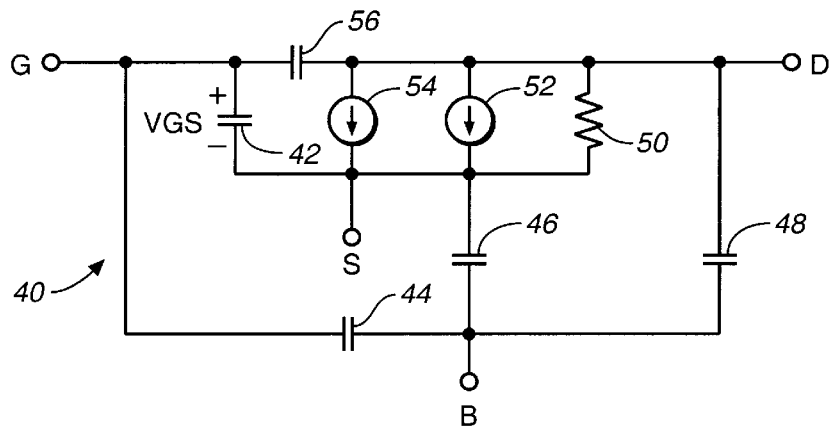
FIG._1B
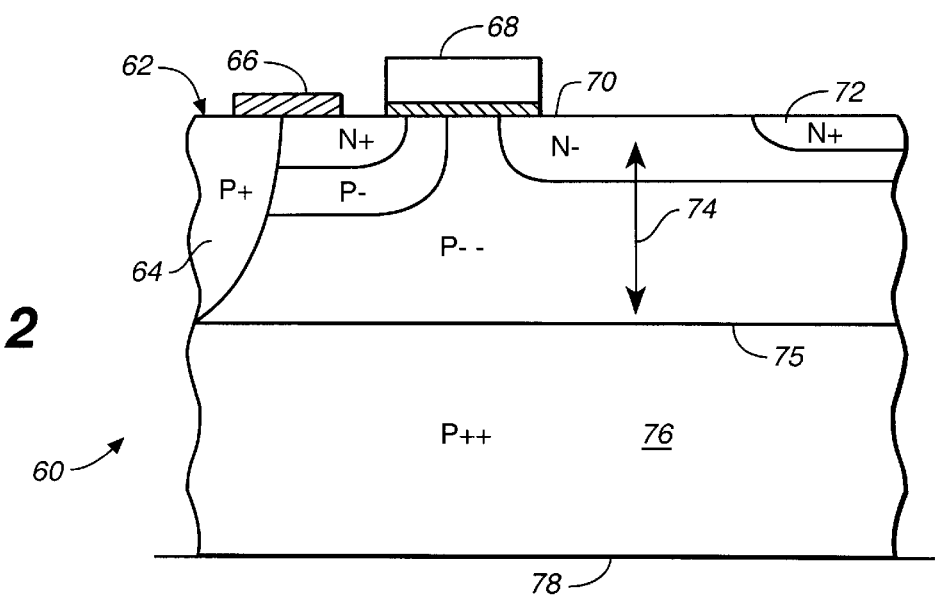
FIG._2

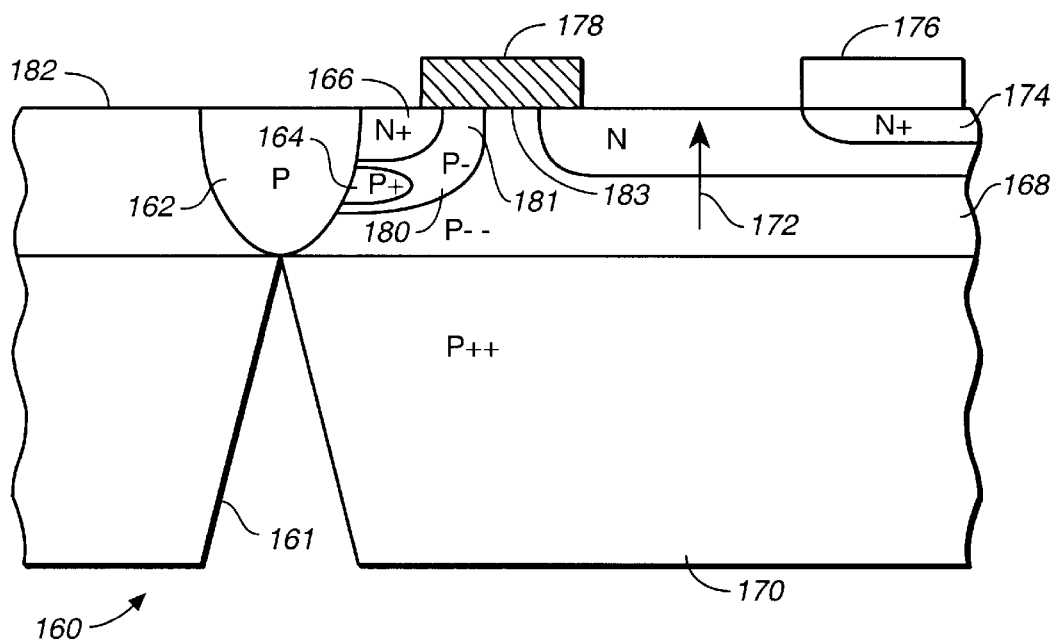
FIG._3
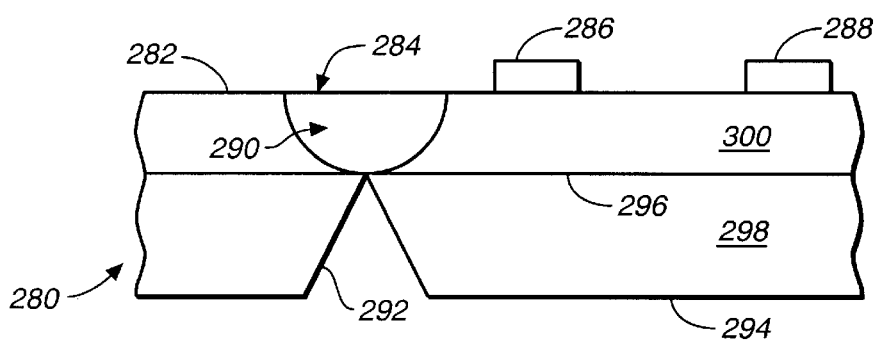
FIG._4

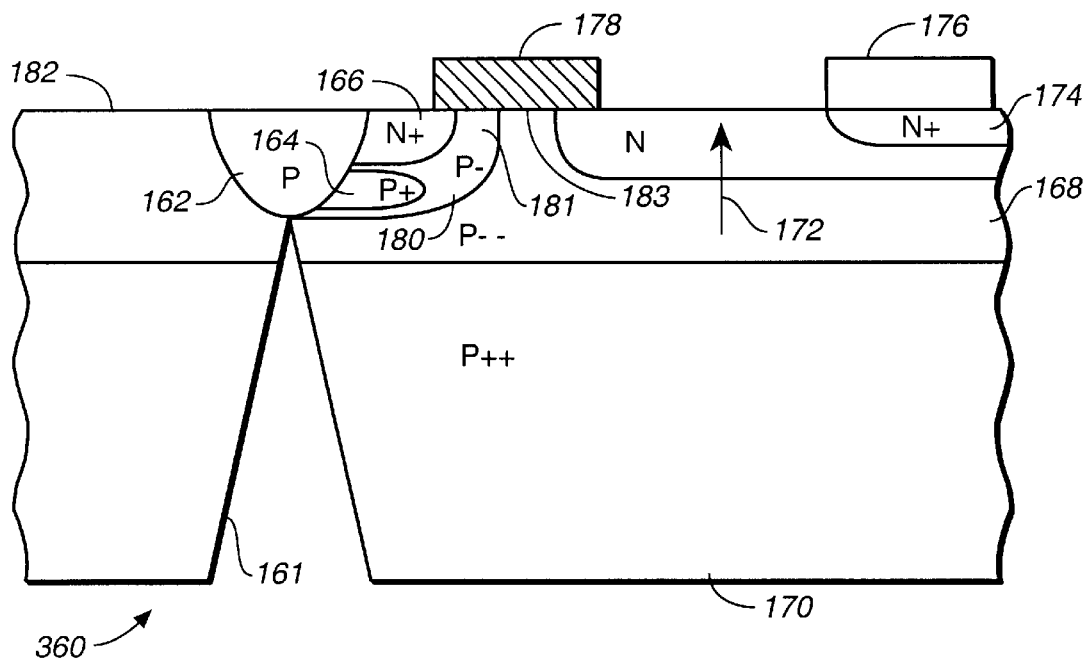
FIG._5
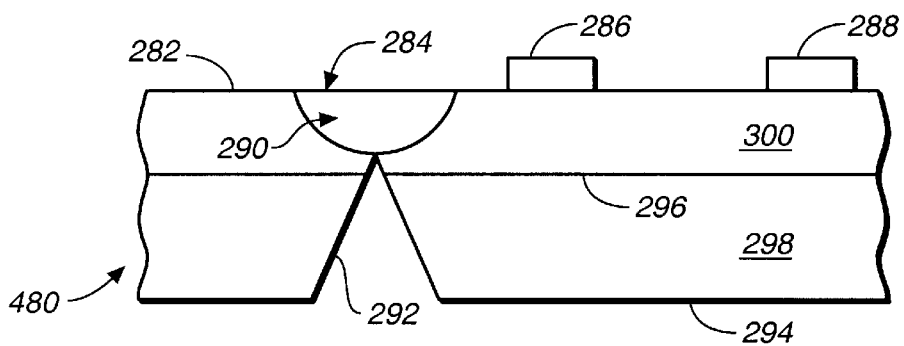
FIG._6

LATERAL RF MOS DEVICE HAVING A COMBINED SOURCE STRUCTURE

This is a divisional patent application for the U.S. patent application Ser. No. 09/020,257, entitled "Source Connection Structure For Lateral RF MOS Devices", filed on Feb. 7, 1998.

BACKGROUND

Power high frequency devices have been built using a variety of semiconductor technologies. For a long time the preferred vehicle for their realization has been the NPN bipolar junction transistor (BJT). Its primary advantage was the achievable high intrinsic transconductance ($g_m$) that permitted the fabrication of high power devices utilizing small silicon areas.

As processing technology improved, in the early 1970's a number of MOSFET vertical structures begun to challenge the dominance of the BJT at the lower RF frequencies, trading the cost of the large silicon area, necessary to provide the current capability in MOSFETs, for the cost of simple processing. The advantages that the MOSFET structure provided to the user were: higher power gain, ruggedness (defined as the capacity to withstand transients) and ease of biasing.

In the continuous quest for high frequency operation at high power the MOSFET structure has displaced the BJT since the early 1970's in applications where its performance has been competitive.

Recently, new prior art RF MOS devices have been placed on the market by several vendors. The new prior art RF MOS devices utilize the standard lateral MOS device with a diffused via that connects the source to the backside of the chip such that the back side becomes both electrical and thermal ground. The prior art structure also uses a polysilicide gate process as a compromise between the fabrication benefits of the self aligned polysilicon gate and the high frequency performance of the metal gate structure. The prior art structure has extended the frequency of operation of MOS devices into the 2 GHz region thus covering frequency bands of great commercial importance: the cellular and PCS/PCN mobile telephone bands.

The via backside contact design and the polysilicide gate processing technology have allowed the prior art device to attain its performance. Firstly, by transferring the source connection to the backside of the chip through a diffused via, the packaging of the device has been simplified reducing parasitic inductance and resistance to ground. The thermal dissipation has been also improved because an electrical isolation layer in the package has been removed. Secondly, the output capacitance of RF MOS device for the common-source mode of amplification operation has been made comparable to the output capacitance obtained with BJT structures. This results in improved collector efficiency and in wider usable bandwidth (BW) of the RF MOS device operating as an amplifier. This improvement comes about as the lateral RF MOS device at high drain-source applied bias has a lower drain-source capacitance ($C_{ds}$) than the drain-source capacitance of the prior art RF MOS devices. Finally, the use of polysilicide allows the efficient feeding of long gate fingers.

The further improvement of the usable bandwidth (BW) of the RF MOS device employed in amplifier circuits can be achieved by improving the design of the existing lateral RF MOS devices.

SUMMARY

The present invention is unique because it allows one to obtain an improvement in usable BW of the RF MOS device employed in amplifier circuits.

One aspect of the present invention is directed to a lateral RF MOS transistor structure having a combined source structure.

In one embodiment, the lateral RF MOS transistor structure comprises: (1) a semiconductor material; (2) a conductive gate overlying and insulated from the top surface of the semiconductor material; (3) an enhanced drain drift region; (3) a drain region; (4) a body region; (5) a source region; (6) a first contact enhancement region; (7) a contact region; and (8) a conductive plug making a direct physical contact between a backside of the semiconductor material and the contact region.

In one embodiment, the semiconductor material is of a first conductivity type, has a first dopant concentration and a top surface. The conductive gate overlies and is insulated from the top surface of the semiconductor material. The enhanced drain drift region of the lateral RF MOS transistor structure comprises a first region of a second conductivity type and has a second dopant concentration formed completely within the semiconductor material. The drain region comprises a second region of the second conductivity type and has a third dopant concentration greater than the second dopant concentration. The body region is of the first conductivity type, has a fourth dopant concentration being equal or greater than the first dopant concentration. The source region of the lateral RF MOS transistor structure is of the second conductivity type and has a fifth dopant concentration. The first contact enhancement region of the lateral RF MOS transistor structure is of the first conductivity type and has a sixth dopant concentration being greater than the fourth dopant concentration of the third region. The contact region is of the first conductivity type and has a seventh dopant concentration.

In one embodiment, the contact region connects the top surface of the semiconductor material to the highly conductive substrate.

In another embodiment, the contact region is located within the semiconductor material.

Finally, a conductive plug makes a direct physical contact between a backside of the semiconductor material and the contact region.

In the preferred embodiment, the first conductivity type is of P type.

In one embodiment, the conductive plug comprises a metal plug. In another embodiment, the conductive plug comprises a silicided plug. The silicided plug can comprise a tungsten silicided plug, a titanium silicided plug, a copper silicided plug; or a platinum silicided plug.

BRIEF DESCRIPTION OF THE DRAWINGS

FIG. 1A shows an idealized NMOS device cross section with depletion and induced channel and with applied positive $V_{GS}$.

FIG. 1B is a small-signal MOS transistor equivalent circuit.

FIG. 2 depicts a lateral view of a prior art lateral RF MOS transistor.

FIG. 3 depicts a detailed lateral view of the combined diffusion and plug contact structure of a lateral RF MOS transistor, wherein the diffusion contact region connects the top surface of the semiconductor material to the highly conductive substrate.

FIG. 4 depicts a simplified lateral view of the combined diffusion and plug contact structure of a lateral RF MOS transistor, wherein the diffusion contact region connects the top surface of the semiconductor material to the highly conductive substrate.

FIG. 5 depicts a detailed lateral view of the combined diffusion and plug contact structure of a lateral RF MOS transistor, wherein the diffusion contact region is located within the semiconductor material.

FIG. 6 depicts a simplified lateral view of the combined diffusion and plug contact structure of a lateral RF MOS transistor, wherein the diffusion contact region is located within the semiconductor material.

DETAILED DESCRIPTION OF THE PREFERRED EMBODIMENTS

An idealized NMOS device cross section with depletion and induced channel and with applied positive $V_{GS}$ is shown in FIG. 1A. For the complete reference, please, see "Analysis and Design of Analog Integrated Circuits" by Paul Gray and Robert Meyer, published by John Wiley & Sons, Inc., 1993.

In the large-signal model of a typical NMOS device, we consider substrate, source, and drain grounded and a positive voltage $V_{GS}$ (between the gate (20) and the substrate (14)) applied to the gate as shown in FIG. 1A. The gate and the substrate form the plates of a capacitor with the layer of silicon oxide ($SiO_2$) (18) as a dielectric. Positive charge accumulates on the gate and negative charge in the substrate. Initially, the negative charge in the P-type substrate is manifested by creation of a depletion region (12) and resulting exclusion of holes under the gate. The depletion-layer width X under the oxide is:

$$X(2\epsilon\phi/qN_A)^{1/2}; \quad (1)$$

where $\phi$ is the potential in the depletion layer at the oxide-silicon interface, $N_A$ (atoms/cm$^3$) is the doping density (assumed constant) of the p-type substrate, and $\epsilon$ is the permittivity of the silicon. The charge per unit area in this depletion region is $$Q=qN_AX=\sqrt{(2qN_A\epsilon\phi)}. \quad (2)$$

When the potential in the silicon reaches a critical value equal to twice the Fermi level $\phi_f$~0.3 V, a phenomena known as "inversion" occurs. Further increases in gate voltage produce no further changes in the depletion-layer width but instead a thin layer of electrons is induced in the depletion layer directly under the oxide. This produces a continuous n-type region (16) with the source (24) and drain (22) regions and is the conducting channel between source and drain. The channel (16) can be modulated by increases or decreases in the gate voltage. In the presence of an inversion layer, and with no substrate bias, the depletion region contains a fixed charge:

$$Q_{b0}=\sqrt{(2qN_A\epsilon\phi_f)}. \quad (3)$$

If a substrate bias voltage $V_{SB}$ (source is positive for n-channel devices) is applied between source and substrate, the potential required to produce inversion becomes ($2\phi_f+V_{SB}$) and the charge stored in the depletion region in general is:

$$Q_b=\sqrt{(2qN_A\epsilon(2\phi_f+V_{SB})}. \quad (4)$$

The gate voltage $V_{GS}$, required to produce an inversion layer, is called the threshold voltage $V_t$ and can be calculated as follows. This voltage consists of several components. First, a voltage $[2\phi_f+(Q_b/C_{Ox})]$ is required to sustain the depletion layer charge $Q_b$, where $C_{Ox}$ is the gate oxide capacitance per unit area. Second, a work-function difference $\phi_{ms}$ exists between the gate metal and the silicon. Third, there is always charge density $Q_{SS}$ (positive) in the oxide at the silicon interface. This is caused by crystal discontinuities at the Si—$SiO_2$ interface and must be compensated by a gate voltage contribution of (−) $Q_{SS}/C_{Ox}$. Thus, we have a threshold voltage:

$$V_t = \phi_{ms} - 2\phi_f + (Q_b/C_{Ox}) - Q_{SS}/C_{Ox} \quad (5)$$
$$= V_{t0} + \gamma\left(\sqrt{2\phi_f+V_{SB}} - \sqrt{2\phi_f}\right);$$

where $\gamma=(1/C_{Ox})\sqrt{2qN_A\epsilon}$, $C_{Ox}=\epsilon_{Ox}/t_{Ox}$, and $\epsilon_{Ox}$ and $t_{Ox}$ are the permittivity and thickness of the oxide, respectively.

The preceding large-signal equations can be used to derive the small-signal model of the MOS transistor in the saturation or pinch-off region. The source-substrate voltage $V_{BS}$ affects threshold voltage $V_t$ (eq. 5) and thus the drain current $I_D$. This is due to influence of the substrate acting as a second gate and is called body effect. As a consequence, the drain current $I_D$ is a function of both $V_{GS}$ and $V_{BS}$, and two transconductance generators (54) and (52) are needed in the small-signal model (40) as shown in FIG. 1B. Variations in voltage $v_{bs}$ from source to body cause current $g_{mb}v_{bs}$ to flow from drain to source. The substrate of this idealized lateral MOS device is the area that we call "body region" in the lateral RF MOS device and is always connected to the most negative supply voltage and is thus an ac ground. Thus, in the present embodiments the "body" effect has no role.

Parasitic resistances due to the channel contact regions should be included in series with the source and drain of the model. These resistances have an inverse dependence on channel width W and have typical values of 50 to 100 Ω for devices with W of about $1\mu$.

The parameters of the small signal model (40) of FIG. 1B can be determined from the I-V characteristics of the NMOS device. For voltages between drain and substrate $V_{DS}$ low in comparison with the Early voltage $V_A$, the transconductance $g_m$ is:

$$g_m=\sqrt{2k'(W/L)I_D}; \quad (6)$$

where $k'=\mu_nC_{Ox}$, $\mu_n$ is the average electron mobility in the channel, L and W are the length and the width of the channel. Thus, like the JFET and unlike the bipolar transistor, the transconductance of the MOS depends on both bias current and the W/L ratio (and also on the oxide thickness via k'). Similarly, the transconductance $g_{mb}$ (52) can be expressed as follows:

$$g_{mb}=[\gamma\sqrt{2k'(W/L)I_D}/(\sqrt{2(2\phi_f+V_{SB})})]. \quad (7)$$

The small-signal output resistance $r_0$ (50) can be expressed as follows:

$$r_0=(\partial I_D/\partial V_{DS})^{-1}=(V_A/I_D). \quad (8)$$

The gate-source capacitance $C_{gs}$ (42) of FIG. 1B is intrinsic to the device operation in the saturation region. On the other hand, the substrate-source capacitance $C_{sb}$ (46) is shorted by a metal finger in the prior art device or by the source plug in the present invention structure, and the drain-source capacitance $C_{db}$ (48) is a parasitic depletion-region capacitance equal to the drain-source $C_{ds}$ capacitance. Therefore, for the lateral RF MOS structure:

$$C_{sb}=0; \quad (9)$$

and $$C_{db}=C_{db0}/(\sqrt{(1+V_{DB}/\phi_0)})=C_{ds0}/(\sqrt{(1+V_{DB}/\phi_0)})=C_{ds}. \qquad (10)$$

The high frequency gain of the lateral RF MOS device is controlled by the capacitance elements in the equivalent circuit. The frequency capability of the lateral RF MOS device is most often specified in practice by determining the frequency where the magnitude of the short-circuit, common gate current gain falls to unity. This is called the transition frequency, $f_T$, and is a measure of the maximum useful frequency of the transistor when it is used as an amplifier. The $f_T$ of the lateral RF MOS is given by:

$$f_T=(1/2\pi)g_m/(C_{gs}+C_{gd}). \qquad (11)$$

The prior art structure (60) depicted in FIG. 2 illustrates one technique to make a connection of the source and body regions in the MOS structure to the backside (78) through the diffusion of a dopant (64) introduced from the topside (62) of the chip and a metal finger short. However, this diffusion not only moves the topside dopant (64) down and sideways but also moves the substrate dopant (76) up thus reducing the distance between the highly doped substrate interface (75) and the drain area (72) of the device. This diffusion movement of the interface (75) produces an increase of the minimum source-drain capacitance $C_{ds}$ that can be obtained under a high voltage bias $V_{DS}$.

The usage of a metal plug in combination with a diffusion area to make a source connection results in two important improvements as compared with the prior art structure of FIG. 2, while leaving the source-drain capacitance $C_{ds}$ the same:

(1) the increase in the RF gain of the transistor; and
(2) the increase in the manufacturing yield, that is the number of transistors that can be carved out of a single wafer.

In one embodiment, the detailed source-body connection structure (160) for lateral RF MOS devices of the present invention is shown in FIG. 3. The structure (160) can be used at high frequency applications, such as the cellular and the PCS regions of the RF spectrum. The device structure (160) comprises: a semiconductor material comprising an epitaxial layer (168) of a first conductivity type and having an epitaxial layer dopant concentration and a top surface (182). In one embodiment, the epitaxial layer's conductivity type is P-type, that is the majority carriers are holes. The dopant concentration of the epitaxial layer is P⁻⁻, wherein (--) indicates that the dopant concentration P⁻⁻ of holes in the epitaxial layer (168) is small comparatively with the hole concentration P in the body region (180) (see discussion below). The typical dimensions of the epitaxial layer (168) are (3–10)$\mu$.

In another embodiment of the present invention, the semiconductor material (168) is of a second N-conductivity type, has a dopant concentration N⁻⁻ and includes a top surface (182). In this embodiment, the majority carriers are electrons.

A conductive gate (178) overlies the top surface (182) of the semiconductor material. The gate (178) is insulated from the semiconductor material by a gate oxide layer (not shown). The gate oxide layer has the dimensions (200–700) Å. In one embodiment, the gate comprises a polysilicon gate.

The region (172) forms an enhanced drain drift region of the RF MOS structure. The region (172) is formed completely within the semiconductor material (168). The enhanced drain drift region (172) has N conductivity type (if the epitaxial layer has P conductivity type and vice versa) and has a dopant concentration N. The enhanced drain region increases the drain-to-source breakdown voltage $V_t$ of the RF MOS structure (160). The enhanced drain region (172) has dimensions (0.1–5.0)$\mu$ laterally, and about (0.2–0.5)$\mu$ vertically.

A drain region (174) is also formed in the semiconductor material (168). The drain region (174) has the N conductivity type (if the epitaxial layer has P conductivity type and vice versa). The drain region (174) has a dopant concentration N+ that is greater than the dopant concentration N of the enhanced region (172). The drain region (174) contacts the enhanced region (172). The typical dimensions of the drain region (174) are (0.5–3.0)$\mu$ horizontally, and (0.1–0.3)$\mu$ vertically.

A body region of the RF MOS structure (180) is also formed in the semiconductor material. The body region (180) has P conductivity type (if the epitaxial layer has P conductivity type and vice versa). The body region has a dopant concentration P that is equal or greater than the dopant concentration P⁻⁻ of the epitaxial layer (168). The body region includes a subregion (181) underlying the conductive gate (178). The remaining portion (183) of the semiconductor material underlying the gate (178) is of P conductivity type (if the epitaxial layer has P conductivity type and vice versa). The typical dimensions of the body region (180) are (0.5–1.5)$\mu$ horizontally or vertically. The body region (180) includes a source contact region (166) being of N conductivity type N (if the epitaxial layer has P conductivity type and vice versa) and having a dopant concentration N⁺. The typical dimensions of the source contact region (166) are (0.5–1.5)$\mu$ horizontally.

The body region (180) also includes a body contact region (164) being of P conductivity type (if the epitaxial layer has P conductivity type and vice versa) and having a dopant concentration P⁺ that is greater than the dopant concentration P of the body region (180). The typical dimensions of the region (164) are (0.5–1.0)$\mu$ vertically or horizontally.

The diffusion source region (162) is formed by using a dopant introduced from the topside (182) of the chip and a metal finger short.

The region (162) forms a conductive region of the combined source structure. The region (162) has a P conductivity type if the epitaxial layer (168) has a P conductivity type, and vice versa. The region (162) has a dopant concentration that is greater than the dopant concentration of the body region (180).

A conductive plug region (161) connects the substrate (170) to the diffusion source region (162).

In one embodiment, as shown in FIG. 3, the diffusion contact region connects the top surface of the semiconductor material (182) to the interface (164) between the highly conductive substrate and the epitaxial layer (168).

In another embodiment, as depicted in FIG. 5, the contact region (162) is located completely within the semiconductor material (168).

The conductive plug structure (161 of FIGS. 3 & 5) can comprise a metal plug or a silicided plug.

The silicided plug can comprise a tungsten silicided plug, a titanium silicided plug, a cobalt silicided plug, or a platinum silicided plug.

In one embodiment, FIG. 4 depicts a simplified version (280) of the structure (160) of FIG. 3. The conductive plug region (292) connects a backside (294) of the substrate (298) to the diffusion region (290) formed in the semiconductor material of the RF MOS structure.

In another embodiment, FIG. 6 depicts a simplified version (480) of the structure (360) of FIG. 5. In this embodiment, the conductive plug region (292) connects a backside (294) of the substrate (298) to the diffusion region (290) that is located completely within the epitaxial layer (300) of the RF MOS structure.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. A lateral RF MOS transistor structure having a combined source structure comprising:

a semiconductor material of a first conductivity type, said semiconductor material having a first dopant concentration and a top surface;

a conductive gate overlying and insulated from said top surface of said semiconductor material;

a first region formed completely within said semiconductor material of said first conductivity type, said first region being of a second conductivity type and having a second dopant concentration to form an enhanced drain drift region of said lateral RF MOS transistor structure;

a second region formed in said semiconductor material, said second region being of said second conductivity type and having a third dopant concentration greater than said second dopant concentration to form a drain region of said lateral RF MOS transistor structure, said second region contacting said first region;

a third region formed in said semiconductor material, said third region being of said first conductivity type and having a fourth dopant concentration to form a body region of said lateral RF MOS transistor structure, said fourth dopant concentration being equal or greater than said first dopant concentration, said third region having a first end underlying said conductive gate, any remaining portion of said semiconductor material underlying said gate being of said first conductivity type;

a fourth region formed in said semiconductor material, said fourth region being of said second conductivity type and having a fifth dopant concentration to form a source region of said lateral RF MOS transistor structure, said fourth region being located within said third region;

a fifth region formed in said semiconductor material, said fifth region being of said first conductivity type and having a sixth dopant concentration to form a first contact enhancement region of said lateral RF MOS transistor structure, said sixth dopant concentration being greater than said fourth dopant concentration of said third region, said fifth region being located within said third region;

a sixth region formed in said semiconductor material, said sixth region being of said first conductivity type and having a seventh dopant concentration to form a contact region of said lateral RF MOS transistor structure, said seventh dopant concentration being greater than said fourth dopant concentration of said third region, said sixth region contacting said third region;

and a conductive plug region formed in said semiconductor material; wherein said conductive plug region makes a direct physical contact between a backside of said semiconductor material and said sixth region formed in said semiconductor material of said lateral RF MOS transistor structure.

2. The lateral RF MOS transistor structure of claim 1, wherein said sixth region further connects said top surface of said semiconductor material to said highly conductive substrate of said lateral RF MOS transistor structure.

3. The lateral RF MOS transistor structure of claim 1, wherein said sixth region is located within said semiconductor material of said first conductivity type.

4. The lateral RF MOS transistor structure of claim 1, wherein said first conductivity type is a P type.

5. The lateral RF MOS transistor structure of claim 1, wherein said conductive plug comprises a metal plug.

6. The lateral RF MOS transistor structure of claim 1, wherein said conductive plug comprises a silicided plug.

7. The lateral RF MOS transistor structure of claim 6, wherein said silicided plug comprises a tungsten silicided plug.

8. The lateral RF MOS transistor structure of claim 6, wherein said silicided plug comprises a titanium silicided plug.

9. The lateral RF MOS transistor structure of claim 6, wherein said silicided plug comprises a copper silicided plug.

10. The lateral RF MOS transistor structure of claim 6, wherein said silicided plug comprises a platinum silicided plug.

* * * * *